(12) United States Patent
Dubey (10) Patent No.: US 8,046,655 B2
(45) Date of Patent: Oct. 25, 2011

(54) AREA EFFICIENT MEMORY ARCHITECTURE WITH DECODER SELF TEST AND DEBUG CAPABILITY

(75) Inventor: Prashant Dubey, Ghaziabad (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 168 days.

(21) Appl. No.: 11/437,420

(22) Filed: May 18, 2006

(65) Prior Publication Data
US 2007/0002649 A1 Jan. 4, 2007

(30) Foreign Application Priority Data
May 18, 2005 (IN) .......................... 1276/DEL/2005

(51) Int. Cl.
*G01R 31/28* (2006.01)
*G06F 11/00* (2006.01)
(52) U.S. Cl. ...................... 714/743; 714/742
(58) Field of Classification Search .......... 714/718–723, 714/743; 365/200–201
See application file for complete search history.

(56) References Cited

U.S. PATENT DOCUMENTS

| 3,995,215 | A | * | 11/1976 | Chu et al. ................. 714/718 |
| 4,639,919 | A | * | 1/1987 | Chang et al. ............... 714/743 |
| 5,331,644 | A | * | 7/1994 | Ishii et al. ................. 714/736 |
| 5,689,514 | A | * | 11/1997 | Saitoh ....................... 714/719 |
| 6,064,244 | A | * | 5/2000 | Wakayama et al. ........... 327/158 |
| 6,072,719 | A | * | 6/2000 | Tanzawa et al. ........... 365/185.03 |
| 6,072,737 | A | * | 6/2000 | Morgan et al. ............... 365/201 |
| 6,191,998 | B1 | * | 2/2001 | Reddy et al. ............... 365/230.05 |
| 6,470,475 | B2 |  | 10/2002 | Dubey ............................ 716/1 |
| 6,721,216 | B2 | * | 4/2004 | Mak et al. ..................... 365/201 |
| 6,743,536 | B2 |  | 6/2004 | Fuglevand |
| 6,745,799 | B1 |  | 6/2004 | Fuglevand |
| 6,773,839 | B2 |  | 8/2004 | Fuglevand et al. |
| 6,805,987 | B2 |  | 10/2004 | Bai et al. |
| 6,806,678 | B2 |  | 10/2004 | Holmes |
| 6,811,906 | B2 |  | 11/2004 | Bai et al. |
| 6,828,050 | B2 |  | 12/2004 | Bai et al. |
| 6,858,335 | B2 |  | 2/2005 | Schmidt et al. |
| 6,912,166 | B2 | * | 6/2005 | Kawai et al. ................. 365/201 |
| 6,922,803 | B2 | * | 7/2005 | Nakao et al. ................. 714/738 |
| 6,939,636 | B2 |  | 9/2005 | Fuglevand et al. |
| 6,982,129 | B1 |  | 1/2006 | Bai et al. |

FOREIGN PATENT DOCUMENTS

WO WO 03/058733 A1 7/2003
WO WO 03/063283 A1 7/2003
* cited by examiner

*Primary Examiner* — Jeffrey A Gaffin
*Assistant Examiner* — Steve Nguyen
(74) *Attorney, Agent, or Firm* — Lisa K. Jorgenson; E. Russell Tarleton; Seed IP Law Group PLLC (57) ABSTRACT

An integrated test device reduces external wiring congestion to a memory. The integrated test device provides for separate decoder testing and debugging to find specific errors in the memory. The device also helps in reducing the complexity of the test of external BIST. Furthermore, the number of clock cycles required for the decoder testing for an N-address memory is reduced from 4N cycles to N clock cycles. Additionally, the access time for the memory is reduced as the test device is used as a pipelining device in normal operation mode.

19 Claims, 5 Drawing Sheets

AREA EFFICIENT MEMORY ARCHITECTURE WITH DECODER SELF TEST AND DEBUG CAPABILITY

BACKGROUND OF THE INVENTION

1. Field of the Invention

The present invention relates to improved area efficient memory architecture with decoder self test and debug capability. More particularly, it relates to providing an integrated test architecture/methodology within the memory for high-speed address decoder testing and high speed memory operation.

2. Description of the Related Art

Over the years, semiconductor devices have become considerably smaller and faster. The semiconductor technology trends have consistently followed Moore's Law as the technology has shrunk by a factor of 1.5 every year. The miniaturization of devices has also resulted in increased complexity and consequently higher clock speeds for integrated circuits. For instance, complex application specific integrated circuits (ASICs) today have several million transistors on a single chip. Since these chips can hold more transistors, a single chip has more logic blocks. As a result, on-chip memories have become extremely popular for fast memory access in System on Chip (SoC) devices. Each memory block takes up significant silicon area and as a result, most of the silicon area on ASICs is dedicated to these embedded memories. As ASIC designs become more memory dominated, the probability of memory errors has increased due to manufacturing faults and process variations. Hence, Design for Test (DFT) and test reliability are very important aspects in the ASIC design process.

The testing is done using on-chip test devices called Built in Self Test (BIST) devices. These BISTs perform failure testing on the memories at very high clock speeds. This is a major bottleneck for the development of reliable high-speed ASICs as most of the current BIST architectures do not provide reliable memory testing at high clock speeds. The few current BIST devices that do provide reliable testing are very inefficient in terms of operation speed.

Today's embedded memories are full custom volatile random access memories (RAMs) that are designed and optimized for high speed, low power and small area. These memories are categorized by their operation mode as synchronous or asynchronous memories. While the synchronous memories perform operations on the edges of the input clock, the operations inside the asynchronous memories are independent of the input clock. The memories are also categorized by their storage means and detection techniques into static or dynamic RAMs (SRAMs/DRAMs). DRAMs occupy less silicon area but the storage elements in DRAMs have to be refreshed at regular intervals. SRAMs are larger memories that do not require regular refreshes and as a result, they have faster access times and are ideal for high speed ASICs. The present invention is discussed in relation to synchronous memories, but the same fundamentals can also be applied to the asynchronous memories as well.

Figure 1:
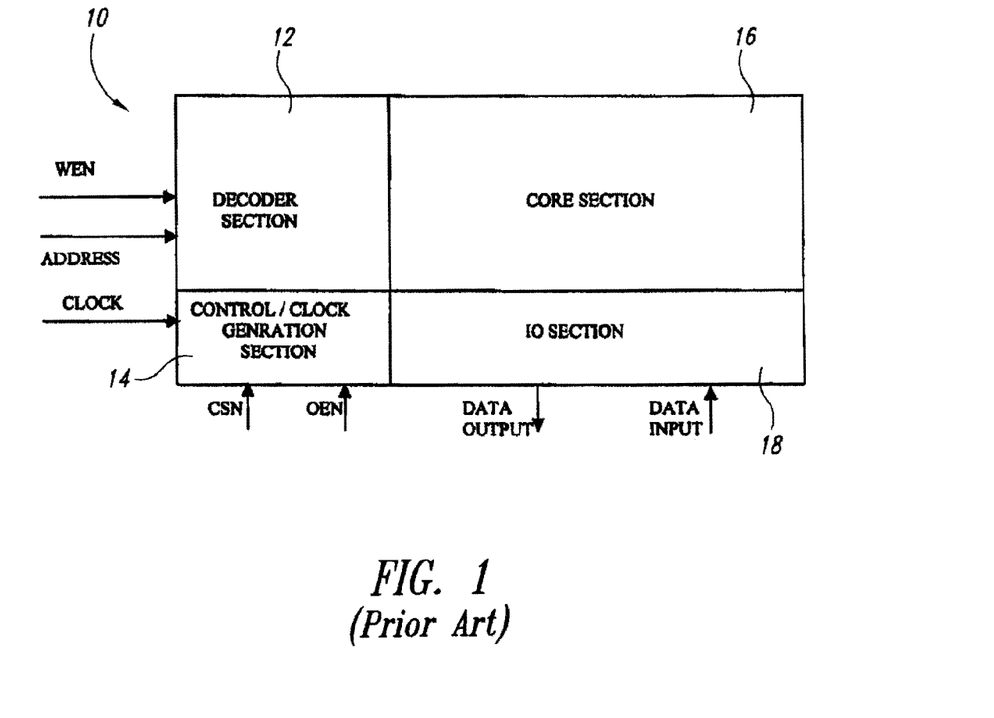
FIG. 1 shows the architecture of a typical single port memory.

FIG. 1 illustrates the structure of a known single port embedded memory 10. The memory contains a data input port (DATA INPUT), an address port (ADDRESS), a memory select port (CSN), an output enable port (OEN), an external clock port (CLOCK), a write enable port (WEN), and an output port (DATA OUTPUT) or a subset of these I/O ports. The structure has an address decoder 12, a control/clock generator 14, a memory core 16, and I/O port blocks 18. Similarly, a dual port memory structure contains two decoders (X and Y decoders), a control/clock generation circuitry, a memory core, I/O port blocks, and several dummy paths. All mentioned blocks are made in form of leaf cells and are abutted to form a memory block of desired word×bit configuration. Hence, full memory design process involves designing all the leaf cells in a new technology and altering the design parameters for interaction between leaf cells for proper memory functioning.

Correct operation of the address decoder and all other leaf cells is very important for proper functioning of the memory. A normal address decoder in a memory contains latches to store the addresses. These addresses are statically decoded and the valid decoded value is clocked to select a row or column (or both) in the memory core to write onto or read from the memory cells. In dynamic decoders the row select signal called the wordline is subjected to a precharge mechanism using an internally generated memory clock. The decoder outputs or the word lines are then used to select the memory cell enable pins. Manufacturing defects in the address decoder can result in faults like stuck-at on the word lines, wrong selection and multiple word line selections. These faults arise when the setup or hold time requirements for decoder latches are not met or there are some other timing problems with the block.

U.S. Pat. No. 6,470,475 relates to a synthesizable synchronous static random access memory that comprises custom built memory cells and a semi-custom input/output/precharge section in bit slice form, a semi-custom built decoder connected to the bit slice, and a semi-custom built control clock generation section connected to the semi-custom built decoder and input/output section. The components may be arranged to provide high-speed access, easy testability, and asynchronous initialization capabilities while reducing design time, and in a size that is significantly smaller than existing semi-custom or standard cell based memory designs. The limitation of the aforementioned patent document is that it does not suggest high speed and minimal clock cycle testing of the memory address decoder.

In prior art, a Built in Self Test (BIST) device performs fault testing for all leaf cells in a memory and generates results for memory as a block. The most common way to detect the address decoder faults is to use some standard march algorithms which contain special march elements in a specified order. These algorithms have several disadvantages as they are highly unreliable in detecting the address decoder faults. As mentioned in book '*Testing Semiconductor Memories: Theory And Practice* 'by A. J. Vande Goor, the disadvantages of current memory testing devices and more specifically decoder testing are as follows:

The tests take about four operations per word to detect the address decoder faults. Hence, the test time for memory address decoder is very large if the memory size is big.

Some other kinds of faults like coupling faults or IO faults may mask the address decoder faults as the fault is detected through the memory output port.

There is no way of viewing the address decoder faults as the paths come out through the memory core.

Debugging the address decoder faults is very hard as segregating the decoder faults from other faults is not possible.

BRIEF SUMMARY OF THE INVENTION

One embodiment of the invention is a test architecture/methodology for an address decoder that reduces the test time and at the same time provides the ability to reliably detect and segregate the address decoder faults from other types of faults. One embodiment of the present invention solves all the problems created by the mentioned disadvantages in the memory address decoder fault testing using the prior art test schemes. Additionally, one embodiment of the present invention results in high-speed memories with negligible area overhead.

One embodiment of the invention is an improved area efficient memory architecture with decoder self test and debug capability.

One embodiment of the invention provides a means for high speed testing of the memory address decoder.

One embodiment of the invention provides a memory architecture resulting in lower access time.

One embodiment of the instant invention provides reliable test results for memory address decoder.

One embodiment of the instant invention provides an improved area efficient memory architecture with decoder self test and debug capability comprising:

a memory core for storing the data;
an input/output (I/O) block connected to said memory core for reading and writing data into said memory core;
a memory control means coupled to said memory core and said I/O block for generating the internal clock and control signals for proper memory operation; and
one or more decoders for receiving address and control signals from said memory control means and generating output for read/write operation on said memory core;
a test control means for generating test control sequences for each decoder, verifying the results of said test control sequences and generating a test status output;
a reference generator for generating a known valid output corresponding to the decoder output for said test control sequence; and
a comparator for comparing the output from each said decoder and said reference generator to identify the fault.

In one embodiment, the test control means comprises:
a test-address generator for generating said address generation sequences for each decoder;
a complementary clock generator for generating complementary clock signals for said reference generator;
a mode control means for operating said test address generator and said complementary clock generator, and generating control signals for switching between the test, debug and normal mode of operation; and
a result checking means having its input connected to the input of said test control means and its output connected to said test status output.

In one embodiment, the reference generator comprises a plurality of storage elements connected together in series through controlled signal passing means to form a ring with predefined outputs from selected storage elements and the control inputs of consecutive signal passing means being connected to complementary clocks from said complementary clock generator.

The reference generator comprises an additional controlled signal passing means at the input of each storage element to enable selective connection to a separate input data line to provide a debugging mechanism; said additional controlled signal passing means coupled to control signals from said mode control means.

In one embodiment:
each storage element is connected to a predefined output;
the alternate storage element is connected to a predefined output to provide the ability to function as a pipelining mechanism; the storage elements are latches;
the controlled signal passing means are transmission gates;
the comparator comprises a compressor for generating a result for said test control means;
the compressor is a logic device that generates a compressed output; and
the test control means is placed below the comparator and the reference generator and adjacent to each decoder for providing an area efficient architecture.

One embodiment of the present invention is a method for providing an improved area efficient memory architecture with decoder self test and debug capability comprising the steps of:
storing the data in a memory core;
connecting an input/output (I/O) block to said memory core for reading and writing data into said memory core;
coupling a memory control means to said memory core and said I/O block for generating the internal clock and control signals for proper memory operation;
applying address and said control signals to one or more decoders for generating output for read/write operation on said memory core; wherein;
test control sequences are generated for each decoder;
a known valid output is generated corresponding to the decoder output for said test control sequence;
the output from each decoder and said known valid output are compared and a result is produced; and
the results are verified and a test status output is generated.

One embodiment of the present invention provides an area efficient memory and an integrated method for decoder self-test and debug capability. The modified memory address decoder has additional blocks within the new memory architecture for the self-test and debug operation. While the memory results in some additional area overhead when compared to the external BIST testing of the decoder, the added blocks are full custom and hence are very area efficient. Additionally, the memory gives a better access and cycle time and has negligible impact on address setup and hold time requirements. The power consumption is nearly the same as well.

BRIEF DESCRIPTION OF THE SEVERAL VIEWS OF THE DRAWINGS

The present invention will now be described with the help of accompanying drawings.

DETAILED DESCRIPTION OF THE INVENTION

One embodiment of the current invention is a complete memory address decoder test solution for a high-speed memory from design to test. The test solution has been designed to keep the performance aspect in mind and has resulted in area and speed efficient memory architecture. Further the memory with integrated decoder test device is designed to operate in test mode, debug mode and memory operation mode for complete testing and debugging of the memory address decoder. The integrated test device is also used as a pipelining device in normal memory operation mode to reduce the memory access time.

Figure 2:
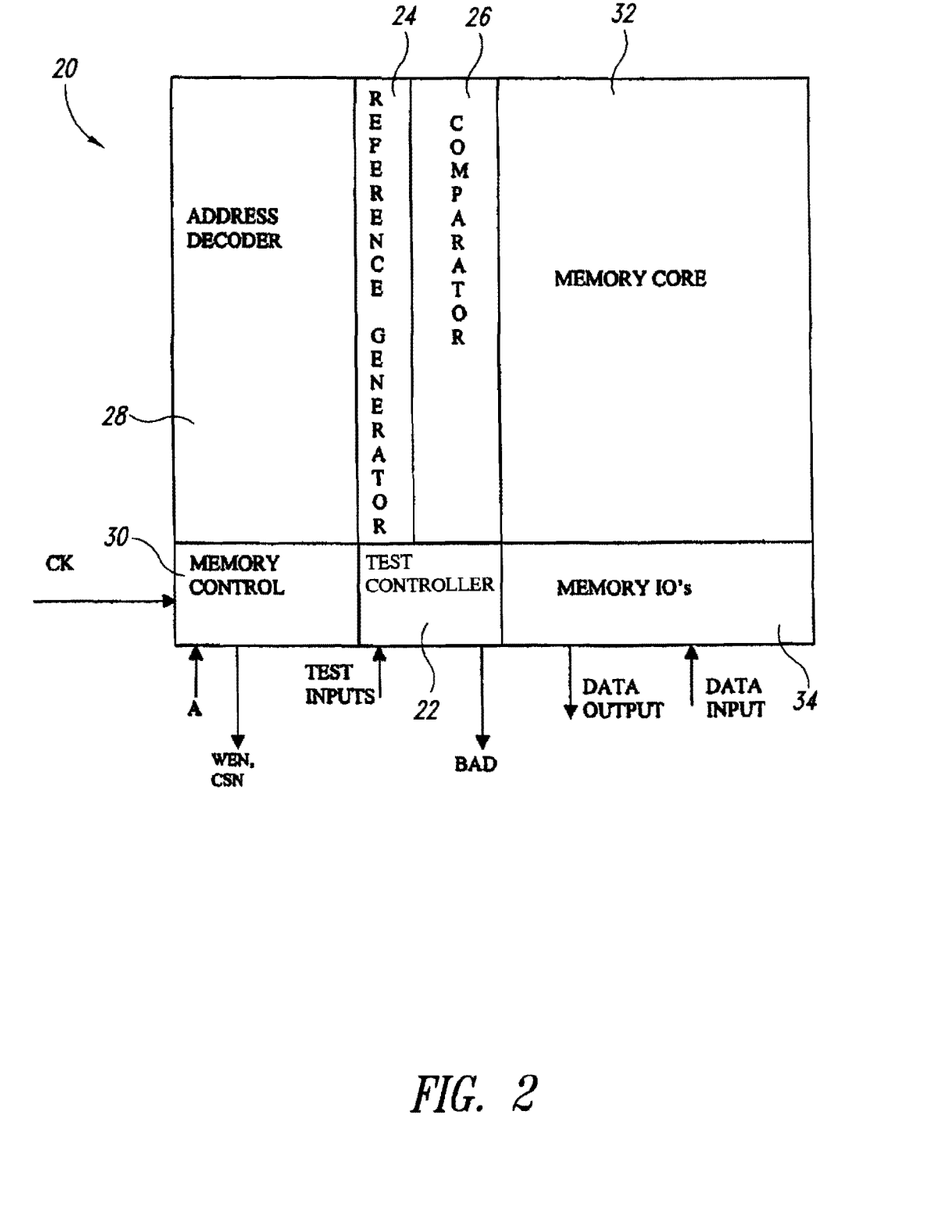
FIG. 2 illustrates the block diagram of a single port memory with additional integrated test blocks in accordance with one embodiment of the invention.

The block diagram of a single port memory device 20 according to one embodiment of the invention is illustrated in FIG. 2. However, the invention is not limited to a single port memory and a similar architecture can be implemented for any memory by introducing a separate test device for each individual decoder. The memory device 20 includes a test controller 22, a reference generator 24, and a comparator block 26 that includes comparators with compressors. The test controller 22 is connected to a memory address decoder 28, a memory controller 30, and the reference generator 24 and receives the output of the comparators. The memory device 20 also includes a memory core 32 and a memory I/O block 34 that transfers data into and out of the memory core 32. The decoder 28 receives address and control signals from the memory controller and generate output for read/write operation on the memory core 32.

The memory address decoder includes a plurality of outputs (one for each wordline for row decoders and one for each column for column decoders) connected respectively to respective first inputs of a plurality of comparators (FIG. 7) in the comparator block 26. The reference generator also includes a plurality of outputs connected respectively to respective second inputs of the comparators in the comparator block 26. The outputs of the comparators are fed respectively to compressors (FIG. 7), which in turn are connected to the test controller 22. The test controller 22 generates a final status output signal, called BAD signal, that indicates whether the address output by the memory address decoder is faulty.

The memory address decoder may be static or dynamic. The reference generator and the compressors added are the overhead in terms of area, but the width of the reference generator is negligible when compared to the reduction in the test time. Further, all components in the test device 20 are optimized for speed and area. The test controller 22 is placed just below the reference generator 24 and comparator 26 blocks for using the unutilized area under the blocks and reducing the memory delay.

Figure 3:
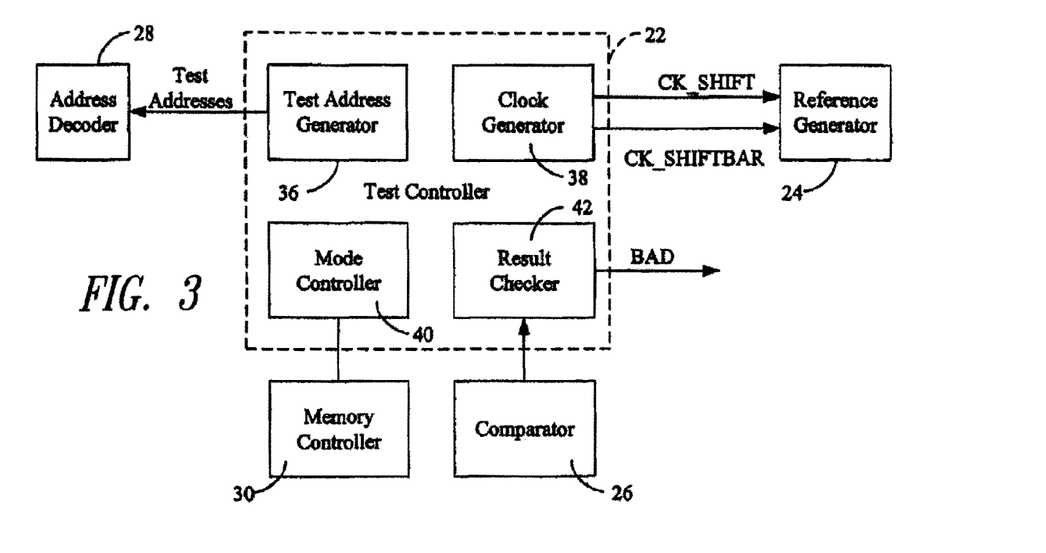
FIG. 3 is a block diagram of a test controller of a test device in one embodiment of the invention.

The test controller 22 comprises a test address generation block 36, a complementary clock generator 38, a mode controller 40, and a result checker 42. The test controller 22 is responsible for managing and coordinating activities in the test device in different operation modes. In the test mode, the test controller 22 initially resets all the memory blocks including blocks within the test device for initialization of test. The test address generation logic 36 is a finite state machine responsible for generating a sequence of test addresses for the decoder. The complementary clock generator 36 in the test controller 22 is also connected to the reference generator 24 for initialization and generation of appropriate outputs for corresponding address from the test address generation block. The mode controller 40 also generates control signals for switching between various operation modes. Further, the result checker 42 continuously receives the output of the compressors of the comparator block 26 and generates a high BAD signal if an error is detected. In the test mode, the test is stopped as soon as an error is detected and a high BAD signal is generated. On the other hand, in debug mode the address of faulty decoder location is output through the result checker. The test controller 22 is deactivated in the normal memory operation mode.

Figure 4:
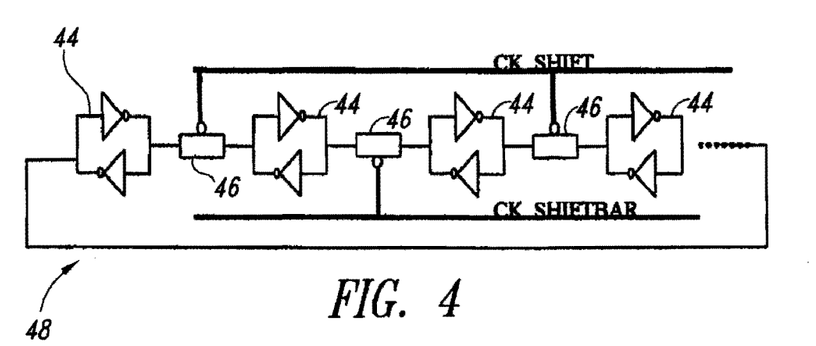
FIG. 4 shows the general architecture of a shift register used in the reference generator in accordance with one embodiment of the invention.

Another key component in the device 20 is the reference generator 24. In an embodiment shown in FIG. 4, the reference generator 24 includes a plurality memory cells 44 (which may be the same as the memory cells of the memory core 32) and pass logic gates 46 to form a shift register 48. FIG. 4 shows the memory cells 44 of the reference generator being implemented by latches, as in SRAM cells, but other memory cells could be employed. The memory cells 44 are connected in series through the respective pass logic gates 46 with the output of the last memory cell being connected to the input of the first memory cell. The clocks CK_SHIFT and CK_SHIFTBAR are two complementary clocks which are received from the clock generator 38 and connected to enable ports of the pass logic gates 46 in the ring configuration in alternating fashion. All pass logic gates have their enable ports connected to one of the two clocks. In a single clock cycle, a stored value is transmitted through two consecutive memory cells 44 as two consecutive logic gates 46 are active for half non-overlapping cycles.

This arrangement of two memory cells form a flip-flop which transmits the stored value to the next flip-flop in one clock cycle. Initially a high signal is fed to the first memory cell 44 in the shift register 48 with all other values initialized at zero. The clock CK_SHIFT or multiple clocks are used at the enable ports of the pass logic gates to synchronously shift the high signal through the serially connected memory cells. The outputs of selected memory cells are used as the output of the reference generator. The reference generator output mimics the behavior of the output of the decoder 28 as a high value is seen at only one wordline at a time. Thus, in test or debug mode, the reference generator acts as a ring counter which generates the expected decoder output for the address under test on every clock cycle. Additionally in debug mode, the reference generator is used to store the address corresponding to a faulty decoder output for the test controller 22.

Figure 5:
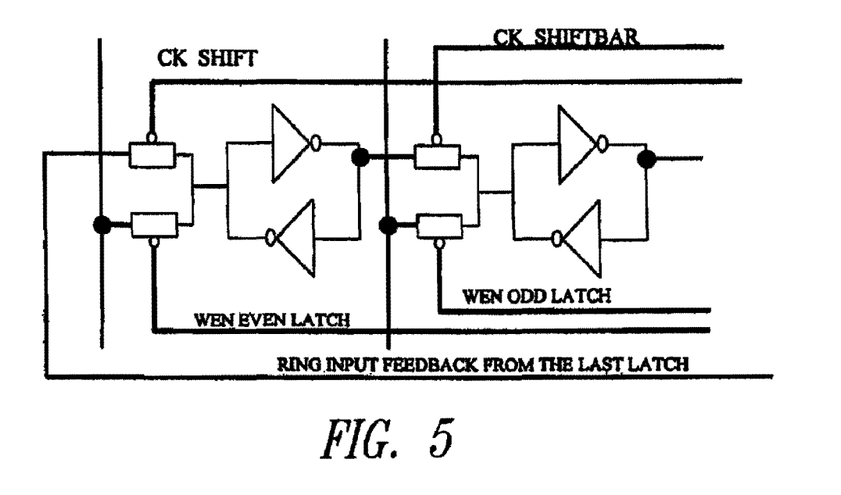
FIG. 5 illustrates the block diagram of a one-column architecture in accordance with one embodiment of the invention.
Figure 6:
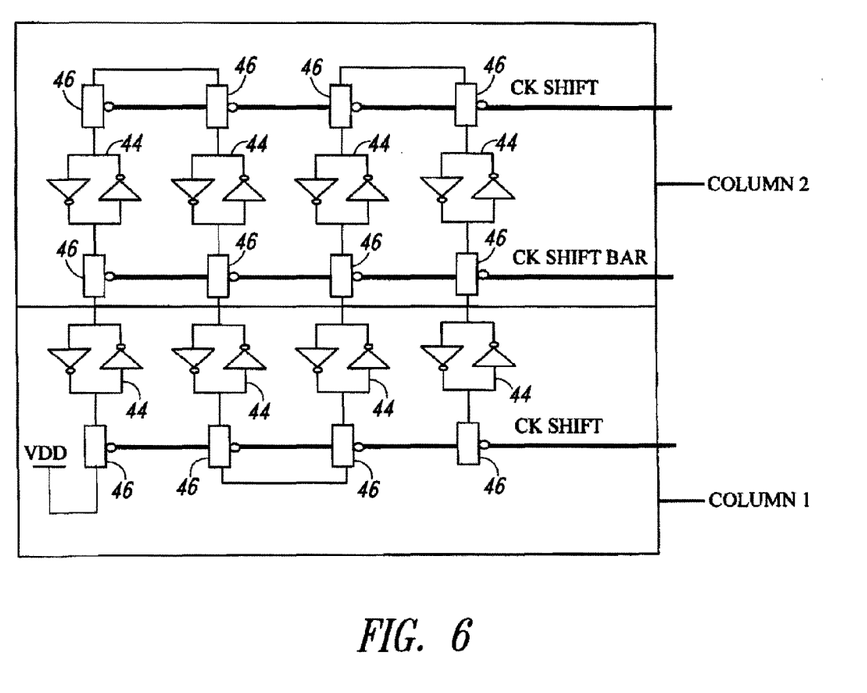
FIG. 6 illustrates the block diagram of a two-column architecture in a shift column logic block in accordance with one embodiment of the invention.

FIGS. 5 and 6 show two different embodiments of the reference generator 24 for efficient memory operation in addition to reliable testing of the address decoder. The two embodiments for the reference generator 24 are termed as 'one-column' or 'two-column' reference generators. The difference in the two embodiments lies in the selected memory cell arrangements. The one-column reference generator, with a vertical chain of memory cells 44 arranged in one column, is illustrated in FIG. 5. For an N-address memory, an array of N memory cells 44 is connected in series with respective pass logic gates between the consecutive memory cells 44. Additionally, the two consecutive pass logic gates in the chain receive the complementary clock signals from the complementary clock generator 38. The value stored in each memory cell 44 is selected as the output of the reference generator. As the high signal is shifted through two memory cells in one clock cycle, the one-column reference generator shifts high through the odd (1, 3, 5 . . . ) or even (0, 2, 4 . . . ) memory cells and the high value is seen correspondingly at even or odd wordlines. Hence in an N-address memory, the test logic block is configured to generate the address corresponding to the odd/even decoder output for first N/2 clock cycles and even/odd decoder output for another N/2 clock cycles.

A one-column reference generator takes two iterations through the decoder to generate all valid decoder output configurations and the complete testing of the decoder takes N clock cycles. The generator is also used to latch the value on the respective wordlines in parallel. Extra logic is employed in the pass logic gates 46 for the latching function, but it helps in debugging a particular decoder output at a later stage. The word line value is latched with the help of the control signals WEN EVEN and WEN ODD. The values of all the odd wordlines is latched using WEN ODD and the values on all the even wordlines is latched using WEN EVEN. These control signals are generated through the mode controller 40 in the test controller 22 and are used to shift any value on the wordline in debug mode. During the latching phase in debug mode, the complementary clock signals are kept at non-active values.

FIG. 6 illustrates the two-column architecture for the reference generator 24. Two memory cells 44 and two pass logic gates 46 connected sequentially with each pass logic gate receiving an inverted clock form a flip-flop. In the two-column architecture, one memory cell and one pass logic gate each from columns 1 and 2 are connected sequentially with all pass logic gates in column 1 receiving the clock signal CK_SHIFT and all pass logic gates in the column 2 receiving the inverted clock signal CK_SHIFTBAR. Hence, an extra column (column 2) of memory cells and pass logic gates is used to form an array of N flip-flops. Additionally, these flip-flops are connected sequentially and the output of last flip-flop is connected to the input of first flip-flop. In the two-column architecture, the output of each sequentially-connected flip flop is the output of the reference generator 24.

Similar to the one-column architecture, the high value is shifted through two memory cells (a flip-flop) in a single clock cycle. Hence, the high value is seen on consecutive reference generator outputs instead of alternate (even or odd) wordlines. Hence, the address generation in the test control means is done corresponding to consecutive wordlines (0, 1, 2, 3 . . . ) after each clock cycle. A similar logic is used for latching the output in a two-column architecture for storing the address in the debug mode. Additionally, the reference generator is used as a pipelining device in the memory architecture resulting in faster memory operation in normal memory operation mode. Hence although, this architecture results in extra area overhead and higher latency time, the effective access time for the memory is reduced.

In case of the one-column architecture, the comparator 26 compares the wordline coming from the address decoder to the corresponding data from the reference generator and the output is compressed and measured for the odd or even wordlines at a time. On the other hand, in case of the two-column architecture, the comparator 26 compares for all the wordlines at the same time, and the output is compressed for all the wordlines. The total run in both cases takes only N clock cycles where N are the number of words in the memory.

Figure 7:
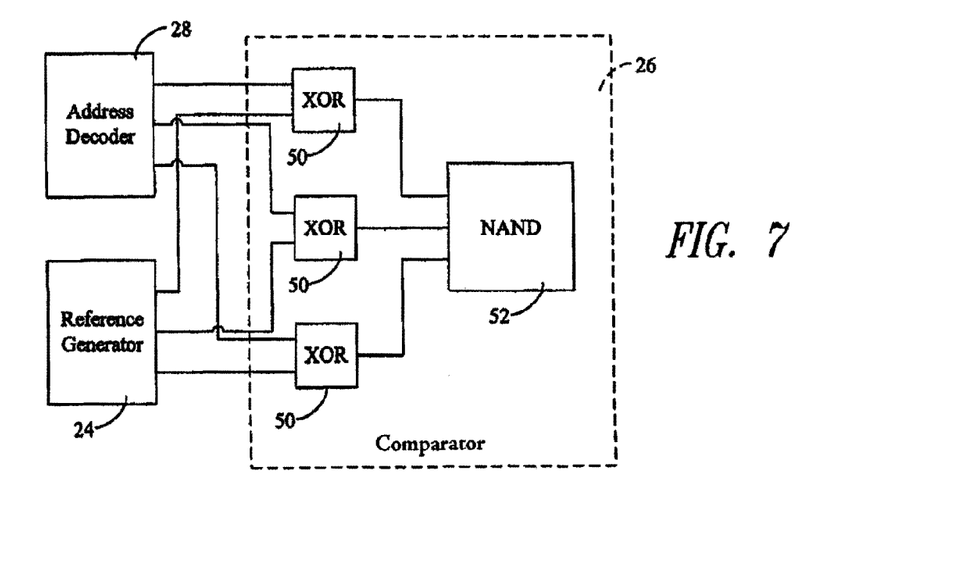
FIG. 7 illustrates a comparator of a test device according to one embodiment of the invention.

One embodiment of the comparator block 26 is shown in FIG. 7. The comparator block includes a plurality of comparators 50, implemented by XOR logic gates, and a compressor 52. A separate XOR logic gate is used for comparison in each wordline. The compressor 52 is a logic block implementing a N/2 input NAND operation in one-column architecture or N input NAND operation in two-column architecture, which produces a logically compressed output in terms of Boolean functions comprising minimal terms. The compressed output is fed continuously to the test controller 22, which generates the BAD signal based on the compressed signal.

The test device 20 provides several advantages over the prior art memory architecture. The test device 20 is an integrated test device thereby reducing external wiring congestion to the memory. The integrated test device provides for separate decoder testing and debugging to find specific errors in the memory. The device also helps in reducing the complexity of the test of external BIST. Furthermore, the number of clock cycles used for the decoder testing for an N-address memory is reduced from 4N cycles to N clock cycles. Additionally, the access time for the memory is reduced as the test device is used as a pipelining device in normal operation mode.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. An area efficient memory architecture with address decoder self test and debug capability, the architecture comprising:
    a memory core to store data;
    an input/output (I/O) block coupled to said memory core and structured to read data from and write data into said memory core;
    a memory control circuit coupled to said memory core and said I/O block to generate internal clock and control signals for proper memory operation;
    a decoder structured to receive address and control signals from said memory control circuit and generate an address output for read/write operation on said memory core;
    a test control circuit to generate a test control sequence for the decoder, to verify results of said test control sequence, and to generate a test status output;
    a reference generator coupled to the test control circuit and having a plurality of latches structured from the same type as memory cells in the memory core and configured to form a ring counter type shift register that is structured to generate a known valid address output corresponding to the decoder address output for the test control sequence, the reference generator latches coupled in series via dual pass gates in which first pass gates are structured to respond to complementary clock signals and are coupled in an odd and even arrangement;
    wherein second pass gates are coupled to odd and even wordlines and are structured to receive a latch signal from the test control circuit and in response thereto latch an output on the odd and even wordlines; and
    a comparator structured to compare the outputs from the decoder and the reference generator to identify whether a fault in the decoder has occurred.

2. The area efficient memory architecture as claimed in claim 1, wherein said test control circuit includes:
    a test address generator structured to generate the test control sequence for the decoder;
    a complementary clock structured to generate complementary clock signals for the reference generator;
    a mode control circuit that is structured to operate the test address generator and the complementary clock generator, and to generate control signals for switching between test, debug, and normal modes of operation;
    a result checking circuit having an input connected to an input of the test control circuit and structured to receive the output of the compressor and having an output connected to said test status output.

3. The area efficient memory architecture as claimed in claim 2, wherein said reference generator latches include a plurality of storage elements coupled together in series through the controlled respective pass gates to form a ring with predefined outputs from the storage elements, wherein consecutive ones of the pass gates have respective control inputs coupled to complementary clocks from said complementary clock generator.

4. The area efficient memory architecture as claimed in claim 3, wherein said reference generator includes controlled signal passing elements at inputs of the storage elements, respectively, to enable selective coupling to a separate input data line to provide a debugging mechanism; said additional controlled signal passing elements coupled to receive control signals from said mode control circuit.

5. The area efficient memory architecture as claimed in claim 3, wherein each storage element is coupled to a predefined output.

6. The area efficient memory architecture as claimed in claim 3, wherein alternate storage elements are coupled to a predefined output to provide an ability to function as a pipelining mechanism.

7. The area efficient memory architecture as claimed in claim 1, wherein said comparator includes a compressor to generate a result for said test control means.

8. The area efficient memory architecture as claimed in claim 7, wherein said compressor includes a logic device that generates a compressed output.

9. The area efficient memory architecture as claimed in claim 1, wherein said test control circuit is placed below the comparator and the reference generator and is adjacent to the decoder to provide area efficiency.

10. The area efficient memory architecture according to claim 1 wherein said decoder includes a plurality of latches, wherein said fault arises from timing of said latches of said decoder.

11. The area efficient memory architecture according to claim 1 wherein said reference generator is implemented as a flip-flop that uses successive memory cells that form a ring, a first of said memory cells in the ring adapted to store a signal having a logic value that travels through the ring, subsequent ones of the memory cells in the ring coupled to each other through a corresponding pass gate so as to enable shifting of the signal having the logic value serially through the subsequent ones of the memory cells, wherein the known valid address output is generated by the ring in one clock cycle.

12. The area efficient architecture according to claim 1 wherein the comparator is adapted to compare a wordline coming from the address decoder to corresponding data from the reference generator, and an output of the comparator is compressed to a single bit and measured for odd or even wordlines at a time, in N clock cycles wherein N is a number of words in the memory.

13. The area efficient architecture of claim 1 wherein the reference generator comprises a column of memory cells arranged in a vertical chain.

14. A testing device to test an address decoder of a memory device, the testing device comprising:
    a test controller structured to provide a test control sequence to the decoder, to verify results of said test control sequence, and to generate a test status output;
    a reference generator coupled to the test controller and structured to generate a known valid address output corresponding to an address output of the decoder for said test control sequence, the reference generator comprising latches structured from the same type as memory cells in the memory core and coupled in series via dual pass gates that are structured to respond to complementary clock signals and are coupled in an odd and even arrangement to form a ring type shift register;
    wherein first pass gates are structured to respond to the complementary clock signals and second pass gates are coupled to odd and even wordlines and are structured to receive a latch signal from the test control circuit and in response thereto latch an output on the odd and even wordlines; and
    a comparator coupled to the decoder and the reference generator and structured to compare address outputs from the decoder and the reference generator to identify whether a fault in the decoder has occurred.

15. The testing device of claim 14, wherein said test controller includes:
    a test address generator structured to generate said test control sequence for the decoder;
    a complementary clock generator structured to generate complementary clock signals for the reference generator;
    a mode controller structured to control the test address generator and the complementary clock generator;
    a result checker having an input coupled to the compressor and an output that provides a test status output.

16. The testing device of claim 14, wherein the reference generator includes a plurality of storage elements coupled together in series through the pass gates to form a ring with outputs from the storage elements, wherein consecutive ones of the pass gates have respective control inputs coupled to complementary clocks.

17. The testing device of claim 16, wherein the reference generator includes controlled signal passing elements at inputs of the storage elements, respectively, to enable selective coupling to a separate input data line to provide a debugging mechanism.

18. The testing device of claim 16, wherein the reference generator includes a plurality of outputs taken respectively at each of the storage elements.

19. The testing device of claim 16, wherein the reference generator includes a plurality of outputs taken respectively at alternating ones of the storage elements to provide an ability to function as a pipelining mechanism.

* * * * *